United States Patent [19]

Yeung

[11] Patent Number: 5,481,216

[45] Date of Patent: Jan. 2, 1996

[54] TRANSISTOR DRIVE CIRCUIT WITH SHUNT TRANSISTOR SATURATION CONTROL

[75] Inventor: Pak-Ho Yeung, San Jose, Calif.

[73] Assignee: National Semiconductor Corporation, Del.

[21] Appl. No.: 251,389

[22] Filed: May 31, 1994

[51] Int. Cl.$^6$ .............................. H03K 17/04; H03K 3/33
[52] U.S. Cl. .......................... 327/333; 327/375; 327/108; 326/78; 326/18
[58] Field of Search ................................... 327/375, 374, 327/376, 377, 319, 315, 333, 108; 326/18, 19, 78, 89

[56] References Cited

U.S. PATENT DOCUMENTS

| | | | |
|---|---|---|---|
| 3,473,047 | 10/1969 | Bohn et al. | 307/215 |
| 3,676,713 | 7/1972 | Wiedmann | 307/300 |
| 3,693,032 | 9/1972 | Winnard | 307/299 |
| 3,766,406 | 10/1973 | Bryant et al. | 326/18 |
| 3,974,402 | 8/1976 | Fett et al. | 307/264 |
| 4,013,903 | 3/1977 | Sakamoto et al. | 327/374 |
| 4,237,388 | 12/1980 | Nokubo et al. | 307/214 |
| 4,246,501 | 1/1981 | Baker | 327/375 |
| 4,288,805 | 9/1981 | Depey | 357/44 |

(List continued on next page.)

FOREIGN PATENT DOCUMENTS

| | | | |
|---|---|---|---|
| 4201947A1 | 7/1993 | Germany | H01L 23/58 |
| 1238204 | 7/1971 | Italy | H03K 17/04 |
| 61-49521 | 3/1986 | Japan | H03K 17/60 |
| 61-161822 | 7/1986 | Japan | H03K 19/088 |
| 61-224727 | 10/1986 | Japan | H03K 18/088 |
| 617844 | 7/1978 | U.S.S.R. | H03K 19/00 |
| 645280 | 1/1979 | U.S.S.R. | H03K 19/00 |
| 860314 | 8/1981 | U.S.S.R. | H03K 19/08 |
| 1001480 | 2/1983 | U.S.S.R. | H03K 19/088 |
| 1012764A | 1/1985 | U.S.S.R. | H03K 19/00 |
| 1324105A1 | 7/1987 | U.S.S.R. | H03K 18/08 |

OTHER PUBLICATIONS

H. Ruegg et al., "A Saturation–Controlled Flip–Flop for Low Voltage Micropower Systems," pp. 60–61, Digest of Technical Papers of the 1971 International Solid State Circuits Conference.

T. Kwap and C. E. Vicary, "Current Switch Receiver," IBM Technical Disclosure Bulletin, vol. 22, No. 11, Apr. 1980, pp. 4922–4924.

H. H. Berger and S. K. Wiedman, "TTL Circuit With Improved Noise Margins," IBM Technical Bulletin, vol. 19, No. 1, Jun. 1976, pp. 142–143.

SER Immune Bipolar Array Cell (31086, disclosed anonymously), one page.

A. Brunin, "Inverted XOR Circuit," IBM Technical Disclosure Bulletin, vol. 21, No. 5, Oct. 1978, p. 1913.

A. S. Chauhan, et al., "Transient Response of a Transistor Employing Limited Saturation Device Technique," Proceedings of the IEEE, Jun. 1977, pp. 986–987.

P. T. Patel, "High Density T$^2$L Logic Circuit," IBM Technical Disclosure Bulletin, vol. 23, No. 7A, Dec. 1980, pp. 2739–2740.

H. Schettler and R. Zuehlke, "Transistor Clamp Circuit," IBM Technical Disclosure Bulletin, vol. 20, No. 3, Aug. 1977, pp. 1056–1057.

Primary Examiner—Timothy P. Callahan
Assistant Examiner—Terry L. Englund
Attorney, Agent, or Firm—Limbach & Limbach

[57] ABSTRACT

A drive transistor has its base coupled to a circuit input and its collector coupled to provide an output current at a circuit output. The output current is responsive to a base current received at the base of the drive transistor. A voltage induced across a resistor connected between the circuit input and the base of the drive transistor indicates the amount of drive transistor base current. A portion of an input current presented at the circuit input is diverted to the circuit output based on the indicated amount of drive transistor base current. The remaining portion of the input current is provided as the drive transistor base current. The drive transistor is thus prevented from saturating.

6 Claims, 2 Drawing Sheets

U.S. PATENT DOCUMENTS

| | | | |
|---|---|---|---|
| 4,675,548 | 6/1987 | Eshbaugh | 307/300 |
| 4,697,102 | 9/1987 | Okabe et al. | 307/454 |
| 4,698,527 | 10/1987 | Matsumoto | 307/475 |
| 4,713,561 | 12/1987 | Yamada | 307/456 |
| 4,857,776 | 8/1989 | Khan | 307/475 |
| 4,970,414 | 11/1990 | Ruth, Jr. | 307/446 |
| 4,988,898 | 1/1991 | Jansson | 307/475 |
| 4,988,899 | 1/1991 | Jansson | 307/475 |
| 5,034,632 | 7/1991 | Jansson et al. | 307/456 |
| 5,036,233 | 7/1991 | Rothermel | 307/570 |
| 5,066,876 | 11/1991 | Fukuda et al. | 326/18 |
| 5,081,376 | 1/1992 | Nitta et al. | 307/475 |
| 5,239,216 | 8/1993 | Sei et al. | 327/575 |

TRANSISTOR DRIVE CIRCUIT WITH SHUNT TRANSISTOR SATURATION CONTROL

TECHNICAL FIELD OF THE INVENTION

The present invention relates to a transistor drive circuit which provides saturation control without the use of Schottky diodes and, in particular, to a transistor drive circuit that employs means for shunting current away from a drive transistor responsive to an indication of an amount of drive transistor base current.

BACKGROUND OF THE INVENTION

A TTL (transistor-transistor logic) NPN-type transistor may be used as a current driver. For example, referring to FIG. 1, an NPN-type drive transistor Q0 of a drive circuit 8 has its base connected to an input terminal 10. The emitter of drive transistor Q0 is connected to a power supply ground rail and its collector is coupled to the power supply upper $V_{cc}$ rail via a pull-up resistor R2. The collector of transistor drive Q0 is connected to an output terminal 12. In response to a current $I_b$ at input terminal 10, a current $I_c$ is produced at output terminal 12.

When $I_b$ becomes too large, the drive transistor Q0 collector voltage can be driven down to low levels, close to the drive transistor Q0 emitter voltage. This causes a condition commonly known as "saturation" where charge is stored in both the base and collector regions of drive transistor Q0. Saturation causes poor performance if it is desired that drive transistor Q0 be employed in high-speed switching applications. For example, for such high-speed applications, when $I_b$ is switched off, it is desired that $I_c$ rapidly switch off in response. However, due to charge storage in the base and collector regions of drive transistor Q0, there is a time delay during which L stays on, even after $I_b$ has switched off.

To keep drive transistor Q0 out of saturation, a Schottky diode D5 may be connected between its base and collector, as shown with the dashed line in FIG. 1. Schottky diode D5 steers excess base-drive current to drive circuit output 12 so that the collector voltage cannot become low enough to cause saturation. Schottky diodes thus provide an effective method for avoiding drive transistor saturation. However, high quality Schottky diodes are not available in all integrated circuit fabrication processes. Therefore, alternative circuit configurations for avoiding drive transistor saturation are desired. One such alternative configuration is shown in FIG. 2. Where the components are the same as those of FIG. 1, they are given the same reference designations. In the drive circuit 18 of FIG. 2, a clamp transistor Q12 is provided with its collector connected to the circuit input 10. The base of clamp transistor Q12 is connected to the collector of clamp transistor Q12. The emitter of clamp transistor Q12 is coupled to output 12. Clamp transistor Q12 has a higher reverse saturation current density than that of drive transistor Q0, when drive transistor Q0 is saturated. Thus, in operation of the drive transistor circuit 18, clamp transistor Q12 steers a large portion of the current $I_b$ at input terminal 10 away from the base of drive transistor Q0. Also, because clamp transistor Q12 has a much lower charge storage time constant than drive transistor Q0, when drive transistor Q0 is saturated, the total amount of charge stored at the base of drive transistor Q0 is significantly reduced.

What is desired is a transistor drive circuit which, in operation, further reduces the total amount of charge stored at the base of the drive transistor.

SUMMARY OF THE INVENTION

A drive circuit in accordance with the present invention comprises a drive transistor having its base coupled to a circuit input and its collector coupled to provide an output current. A current sensor located between the circuit input and the base of the drive transistor senses and indicates the amount of drive transistor base current. A current diverting mechanism diverts a portion of the input current based on the indicated amount of base current. The remaining portion of the input current is provided as the drive transistor base current. The drive transistor is thus prevented from saturating.

A better understanding of the features and advantages of the invention will be obtained by reference to the following detailed description and accompanying drawings which set forth an illustrative embodiment in which the principles of the invention are utilized.

DETAILED DESCRIPTION OF THE INVENTION

Figure 1:
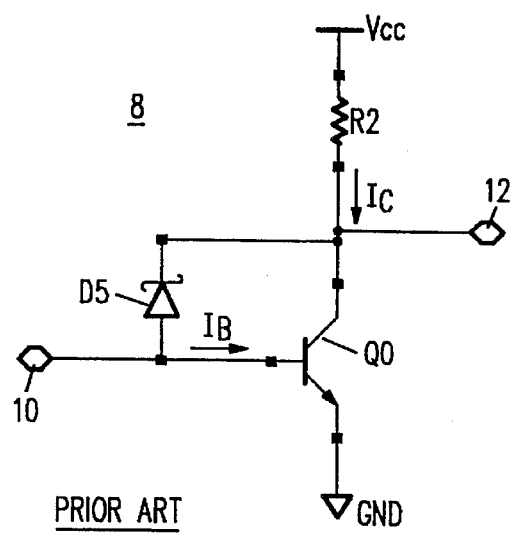
FIG. 1 is a schematic diagram illustrating a conventional transistor drive circuit employing a drive transistor and a Schottky diode clamp.
Figure 2:
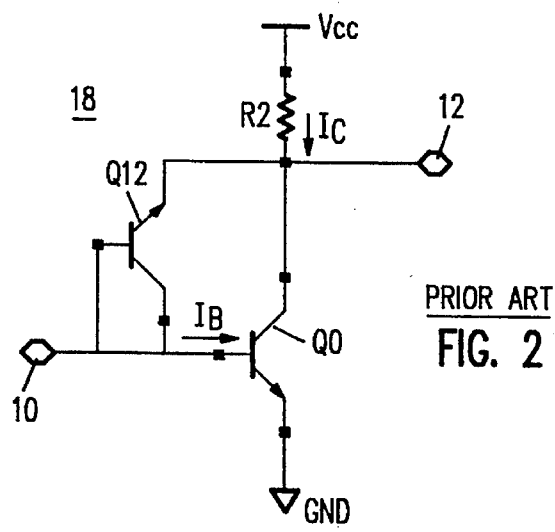
FIG. 2 is a schematic diagram illustrating a conventional transistor drive circuit employing a drive transistor and a clamp transistor, where the clamp transistor has a higher reverse saturation current density and a smaller charge storage time constant than the drive transistor in saturation.
Figure 3:
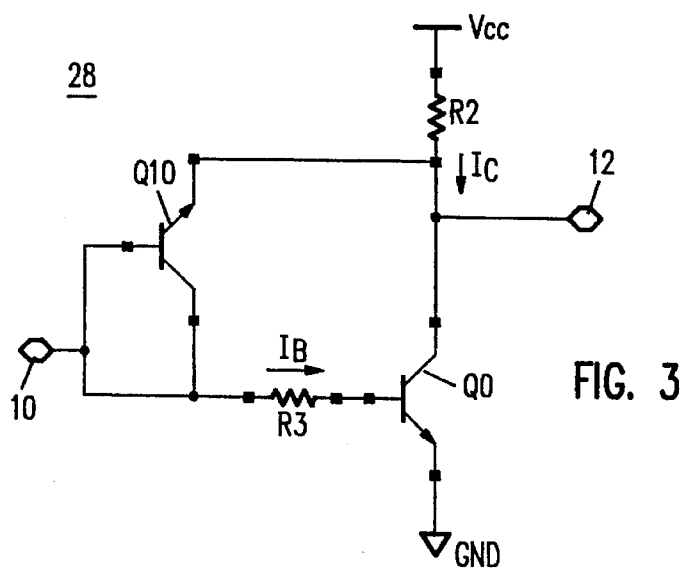
FIG. 3 is a schematic diagram illustrating a transistor driver circuit in accordance with a first embodiment of the present invention.

FIG. 3 shows a drive circuit 28 in accordance with the present invention. Where the components in the FIG. 3 circuit 28 are the same as those of the circuits shown in FIGS. 1 and 2, they are given the same reference designations.

In the drive circuit 28, drive transistor Q0 has its collector coupled to a power supply upper rail $V_{cc}$ via a resistor R2 and its emitter coupled to a power supply lower rail GND. As with the prior art circuits of FIGS. 1 and 2, transistor Q0 has its base coupled to a circuit input 10 and its collector coupled to provide an output current, responsive to a base current received at the drive transistor Q0 base, at a circuit output 12. A resistor R3 connected between circuit input 10 and the base of drive transistor Q0 senses the amount of drive transistor Q0 base current. That is, the voltage across the resistor R3 indicates the amount of drive transistor Q0 base current.

As further shown in FIG. 3, drive circuit 28 also includes a shunt transistor Q10 that diverts a portion of the input current received at circuit input 10 to circuit output 12 responsive to the voltage across the resistor R3. Only the remaining portion of the input current is provided as the drive transistor Q0 base current. It should be noted that shunt transistor Q10 need not have a greater reverse saturation current density than drive transistor Q0.

Those skilled in the art will appreciate that the higher the drive transistor Q0 base current, the greater the voltage across resistor R3, and the greater the portion of the input current that is diverted to circuit output 12. When the current to the base of drive transistor Q0 is small drive transistor Q0 is not saturated, but when the current to the base of drive transistor Q0 is large drive transistor Q0 is saturated. Thus, because of the current sensing and diversion mechanism, drive transistor Q0 is prevented from saturating when the input current is great, but substantially the entire input current is available to the base of drive transistor Q0 when the input current is small.

Figure 4:
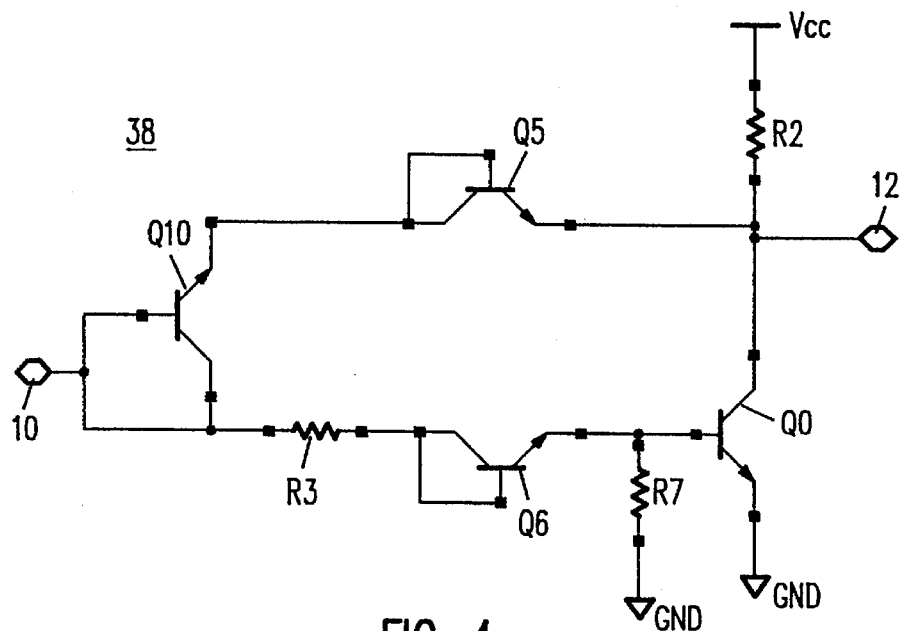
FIG. 4 is a schematic diagram illustrating a transistor drive circuit in accordance with an alternative embodiment of the present invention.
Figure 5:
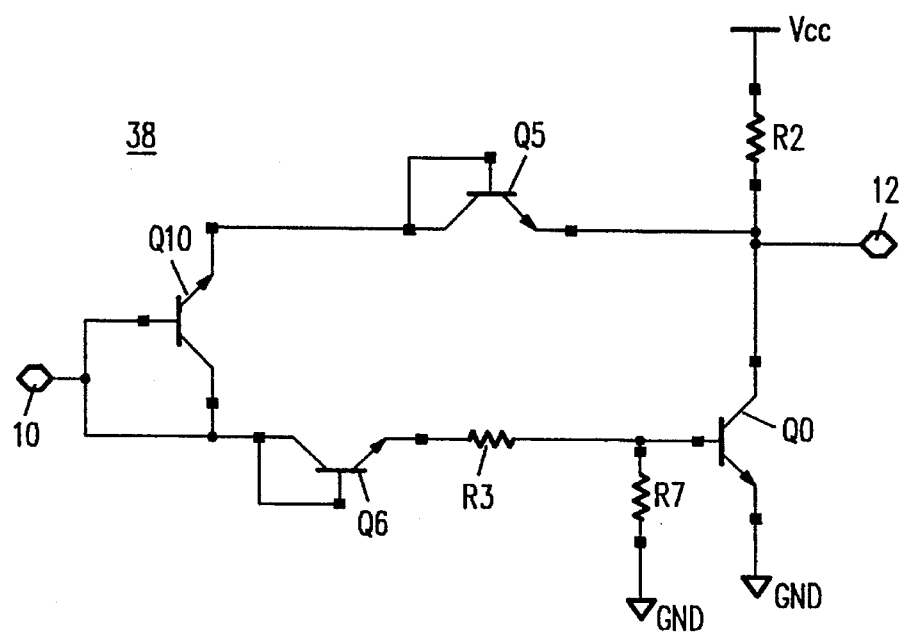
FIG. 5 is a schematic diagram illustrating a transistor driver in accordance with a second alternative embodiment of the present invention.

Because shunt transistor Q10 typically has a low emitter to base/collector breakdown voltage, shunt transistor Q10 may break down when subjected to large supply voltages. An alternative embodiment of the invention, transistor drive circuit 38, shown in FIG. 4, overcomes this problem. A diode-connected buffer transistor Q5 is connected between the emitter of shunt transistor Q10. Diode-connected buffer transistor Q5 shifts the voltage at the emitter of shunt transistor Q10 to provide breakdown buffering for shunt transistor Q10. A corresponding level shift diode-connected transistor Q6 is interposed between the base of drive transistor Q0 and resistor R3 to shift the voltage at the collector of drive transistor Q0 to be at a TTL-compatible level. Alternatively, as shown in FIG. 5, level shift diode-connected transistor Q6 may be interposed between resistor R3 and circuit input 10. A resistor R7 connected between the base of drive transistor Q0 and the power supply lower rail GND provides an active discharge path for drive transistor Q0 base charge. The combination of diode-connected buffer transistor Q5 and level shift diode connected transistors Q6 maintain TTL compatible levels at output terminal 12.

It should be understood that various alternatives to the embodiments of the invention described herein may be employed in practicing the invention. It is intended that the following claims defines the scope of the invention and that methods and apparatus within the scope of these claims and their equivalents be covered thereby.

What is claimed is:

1. A drive circuit, comprising:

a drive transistor having a base, an emitter, and a collector, said base coupled to a circuit input and said collector coupled to a circuit output such that the drive transistor responds to a base current received at said base by providing an output current at the circuit output;

a first resistive element connected between said circuit input and said base of said drive transistor for sensing the base current, a voltage developed across said first resistive element indicating the amount of the base current;

a shunt transistor having a collector, a base, and an emitter, said collector of said shunt transistor and said base of said shunt transistor coupled together and to said circuit input, and said emitter of said shunt transistor coupled to said circuit output and responsive to said indicated amount of base current for diverting a portion of an input current received at said circuit input to said circuit output, the remaining portion of said input current being provided as the base current first level shifting means connected between said emitter of said shunt transistor and said circuit output for buffering said shunt transistor;

second level shifting means connected between said base of said drive transistor and said first resistive element, said first level shifting means and said second level shifting means collectively for shifting the voltage at said collector of said drive transistor to be at a TTL-compatible level; and a resistive element coupling the base of said drive transistor to a power supply lower rail that provides an active discharge path for said base of said drive transistor, wherein said collector of said drive transistor is coupled to said circuit output and said emitter of said drive transistor is also coupled to the power supply lower rail.

2. A drive circuit as in claim 1, wherein said second resistive element comprises a resistor coupled between said base of said drive transistor and said power supply lower rail.

3. A drive circuit as in claim 1, wherein said second level shifting means is a diode-connected transistor.

4. A drive circuit, comprising:

a drive transistor having a base an emitter, and a collector, said base coupled to a circuit input and said collector coupled to a circuit output such that the drive transistor responds to a base current received at said base by providing an output current at the circuit output;

a first resistive element connected between said circuit input and said base of said drive transistor for sensing the base current, a voltage developed across said first resistive element indicating the amount of the base current;

a shunt transistor having a collector, a base, and an emitter, said collector of said shunt transistor and said base of said shunt transistor coupled together and to said circuit input, and said emitter of said shunt transistor coupled to said circuit output and responsive to said indicated amount of base current for diverting a portion of an input current received at said circuit input to said circuit output, the remaining portion of said input current being provided as the base current first level shifting means connected between said emitter of said shunt transistor and said circuit output for buffering said shunt transistor;

second level shifting means connected between said first resistive element and said coupled base and collector of said shunt transistor, said first level shifting means and said second level shifting means collectively for shifting the voltage at said collector of said drive transistor to be at a TTL-compatible level; and a second resistive element coupling the base of said drive transistor to a power supply lower rail that provides a discharge path for said base of said drive transistor wherein said collector of said drive transistor is coupled to said circuit output and said emitter of said drive transistor is also coupled to the power supply lower rail.

5. A drive circuit as in claim 4, wherein said second resistive element is a resistor coupled between said base of said drive transistor and said power supply lower rail.

6. A drive circuit as in claim 4, wherein said second level shifting means is a diode-connected transistor.

* * * * *

UNITED STATES PATENT AND TRADEMARK OFFICE
CERTIFICATE OF CORRECTION

PATENT NO. : 5,481,216
DATED : January 2, 1996
INVENTOR(S) : Pak-Ho Yeung

It is certified that error appears in the above-indentified patent and that said Letters Patent is hereby corrected as shown below:

In the claims:

In Col. 4, line 10, please insert -- second -- before "resistive".

Signed and Sealed this

Sixteenth Day of April, 1996

Attest:

BRUCE LEHMAN

Attesting Officer

Commissioner of Patents and Trademarks